(12) United States Patent
Wolf et al.

(10) Patent No.: US 10,916,536 B2
(45) Date of Patent: Feb. 9, 2021

(54) ESD PROTECTION DEVICE FOR A MEMS ELEMENT

(71) Applicant: Robert Bosch GmbH, Stuttgart (DE)

(72) Inventors: Robert Wolf, Dresden (DE); Andreas Finn, Dresden (DE); Daniel Maier, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/549,379

(22) Filed: Aug. 23, 2019

(65) Prior Publication Data

US 2020/0066708 A1    Feb. 27, 2020

(30) Foreign Application Priority Data

Aug. 27, 2018  (DE) .......................... 10 2018 214 475

(51) Int. Cl.
*H01L 27/02* (2006.01)

(52) U.S. Cl.
CPC ................................ *H01L 27/0248* (2013.01)

(58) Field of Classification Search
CPC . H01L 27/0248; H01L 27/02; H01L 27/0285; H01L 27/0255; H01L 29/0623; H01L 29/06

USPC ......................................................... 257/659
See application file for complete search history.

(56) References Cited

U.S. PATENT DOCUMENTS

| | | | |
|---|---|---|---|
| 2010/0245307 A1* | 9/2010 | Kimura ............... | G09G 3/3696 345/206 |
| 2017/0358570 A1* | 12/2017 | Taghizadeh Kaschani ................. | H01L 29/0623 |
| 2018/0083439 A1* | 3/2018 | Fitzgerald .............. | H02H 9/041 |
| 2020/0083212 A1* | 3/2020 | Zhao ...................... | H02H 9/045 |
| 2020/0139677 A1* | 5/2020 | Adib ...................... | B32B 9/005 |
| 2020/0161292 A1* | 5/2020 | Chen .................. | H01L 29/0821 |
| 2020/0176251 A1* | 6/2020 | Cook ..................... | H01L 29/87 |
| 2020/0176441 A1* | 6/2020 | Gorbachov ............... | H03F 1/52 |

FOREIGN PATENT DOCUMENTS

| | | |
|---|---|---|
| DE | 102016117185 A1 | 4/2017 |
| DE | 102017121611 A1 | 3/2018 |

* cited by examiner

*Primary Examiner* — Alexander O Williams
(74) *Attorney, Agent, or Firm* — Norton Rose Fulbright US LLP; Gerard Messina

(57) ABSTRACT

An ESD protective device for a MEMS element is described as having at least one first line; at least one n-region connected to the first line; at least one insulating region connected to the n-region; at least one p-region connected to the insulating region; at least one second line connected to the p-region; the n-region, the insulating region, and the p-region being situated on a substrate.

4 Claims, 3 Drawing Sheets

ESD PROTECTION DEVICE FOR A MEMS ELEMENT

FIELD OF THE INVENTION

The present invention relates to an ESD protective device for a MEMS element. In addition, the present invention relates to a method for producing an ESD protective device for a MEMS element.

BACKGROUND INFORMATION

Electrical circuits can be damaged by electrostatic discharge (ESD). The current and voltage peaks that occur during ESD shocks cause, at bottlenecks or during p-n junction breakdowns, local excess temperature peaks that can damage the component. In particular in the case of application-specific integrated electronic circuits (ASICs), protection against ESD damage is important, and the implementation of ESD protective structures plays a decisive role. These structures are frequently connected parallel to supply lines of the corresponding circuits. When there is ESD, the electrical current is conducted away by the protective structure. In this way, the occurring electrical voltages are limited to a level that does not damage the other structures. In micromechanical electrical components (MEMS), ESD robustness is usually of secondary importance. Measures increase, for example, only the electrical strength of subcomponents, e.g. by enlarging distances between p-doped and n-doped regions. However, this measure can be used only to a limited extent. Current MEMS designs cannot provide the required ESD strength in this way.

In ASIC design, ESD protective structures are for example realized as: grounded-gate MOS, active clamp, clamping diodes. However, these structures cannot be realized in the MEMS process, because in such a process for example MOS transistors are not available.

SUMMARY

It is an object of the present invention to provide an easily realized ESD protective structure for a MEMS element.

According to a first aspect, this object is achieved by an ESD protective device for a MEMS element, having:
 at least one first line;
 at least one n-region connected to the first line;
 at least one insulating region connected to the n-region;
 at least one p-region connected to the insulating region;
 at least one second line connected to the p-region;
 the n-region, the insulating region, and the p-region being situated on a substrate.

In this way, p-regions and n-regions configured in alternating fashion are provided with substrate connections, thereby forming a diode formed between the p and n-regions and having a protective function, which diode is used, together with a resistor of the substrate, for the uniform distribution of an electrical overcurrent resulting from an ESD event.

In this way, a distributed protective element is provided that distributes the electrical current generated by the ESD event in a thermal volume, so that in this way thermal overload can be avoided and damage to the MEMS element can be avoided.

The electrical fault current flows into the depths of the substrate of the MEMS element through the separating insulating region situated between the n- and p-regions.

As a result, in this way a kind of intermediate protection is provided for the MEMS element until this element is completely blocked and other protective structures subsequently take over the protective function.

According to a second aspect, the object is achieved by a method for producing an ESD protective device for a MEMS element, having the steps:
 providing at least one first line;
 providing at least one n-region connected to the first line;
 providing at least one insulating region connected to the n-region;
 providing at least one p-region connected to the insulating region;
 providing at least one second line connected to the p-region;
 the n-region, the insulating region, and the p-region being situated on a substrate.

An advantageous development of the ESD protective device is distinguished in that a defined number of first lines, n-regions connected to the first lines, insulating regions connected to the n-regions, p-regions connected to the insulating regions, and second lines connected to the p-regions are situated on the substrate. Due to the multiplicity of the named elements, an improved ESD protective effect is achieved for the MEMS element as a whole.

A further advantageous development of the ESD protective device is distinguished in that the ESD protective device is produced in a MEMS process. Advantageously, in this way the ESD protective structure can be provided using the processing capabilities of a MEMS process, which are limited compared to a complete semiconductor process.

In the following, the present invention, with further features and advantages, is described in detail on the basis of a plurality of Figures. The Figures are in particular intended to illustrate the essential principles of the present invention, and are not necessarily true to scale. For clarity, it may be provided that not all reference characters are shown in all the Figures.

Disclosed method features result analogously from corresponding disclosed device features, and vice versa. This means in particular that features, technical advantages, and embodiments relating to the method for producing an ESD protective device for a MEMS element result analogously from corresponding embodiments, features, and advantages relating to the ESD protective device for a MEMS element, and vice versa.

DETAILED DESCRIPTION

The present invention provide an ESD protective structure for a MEMS element that can be realized using the limited process capabilities of a MEMS process. In this way, the robustness of electrical circuits of MEMS sensors against ESD events can be significantly increased.

In this way, an implementation of an ESD protective structure within the MEMS, using the possibilities limited by the MEMS process, is advantageously enabled. The proposed ESD protective structure for MEMS is characterized in particular by the following points:

- in normal operation (disregarding electrical leakage currents), it is not conductive, and thus has no influence on other electrical circuits of the MEMS element;
- when there is ESD, it ensures that the potential difference occurring there between two electrical points, exceeding the potential difference present in normal operation, is dismantled, in that it provides an alternative path between the two points;
- the conducting away of the electrical current generated by the ESD event via the protective structure is realized in such a way that the protective structure is not destroyed during the conducting away;
- the protective structure is capable of being realized using the reduced MEMS process complexity.

In this way, the voltage and current peaks generated by the ESD shock are attenuated in the respective component, increasing robustness against cases of ESD in general.

Figure 1:
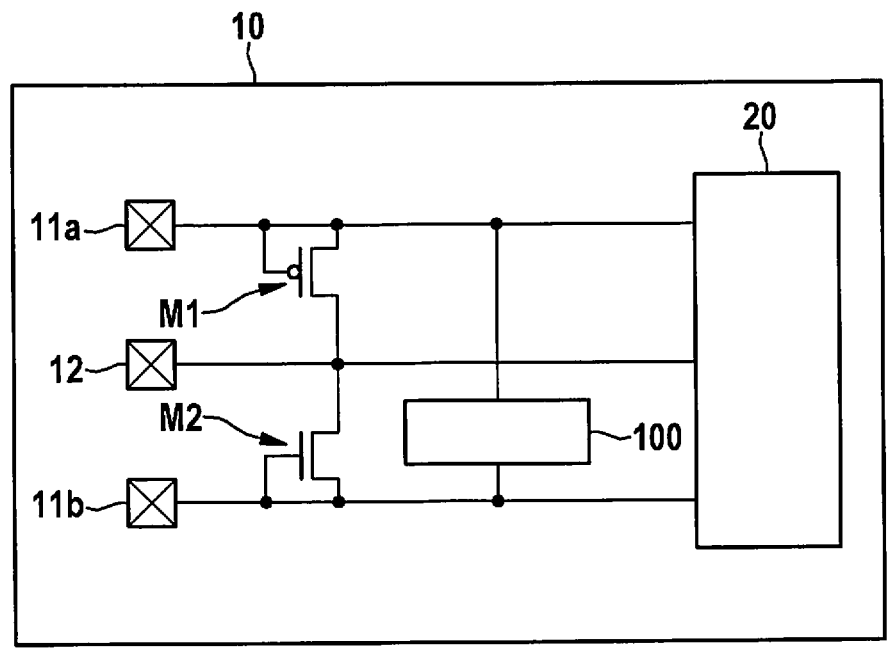
FIG. 1 shows a schematic diagram of a conventional ESD protective structure for an ASIC element.

FIG. 1 shows a conventional protective device or structure 100 (clamp), produced by a complete MOS process, for an ASIC element 10 having an electronic circuit 20 that is to be protected. It will be seen that protective device 100 is connected between terminals 11a, 11b of circuit 20 to be protected of ASIC element 10, which recognizes a rapid increase of an electrical voltage, so that when there is an ESD fault protective device 100 becomes electrically conductive, and can thus distribute the electrical current between the networks of terminals 11a, 11b. A respective MOS-FET M1, M2 is connected between terminals 11a, 11b. MOS-FETs M1, M2 each have a parasitic lateral bipolar transistor used for the protective function.

Figure 2:
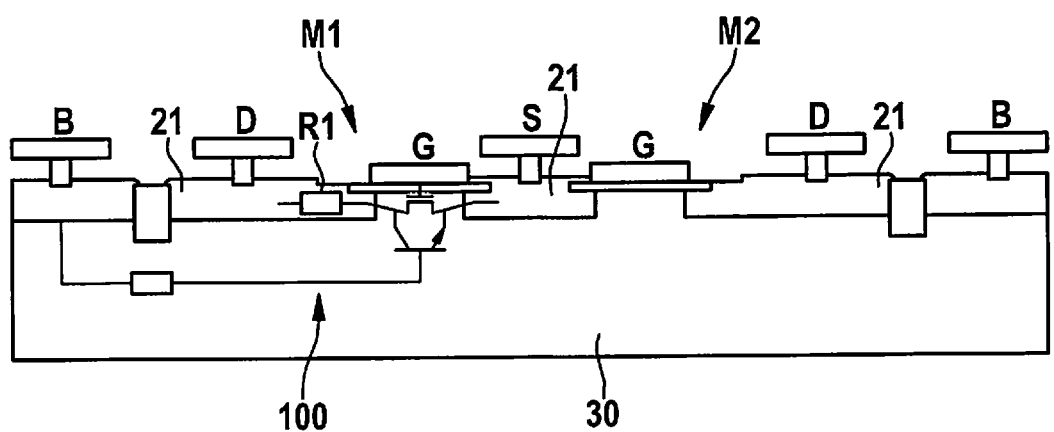
FIG. 2 shows a cross-sectional view of the conventional ESD protective structure for an ASIC element of FIG. 1.

FIG. 2 shows, in a cross-sectional view, a detail of the configuration of FIG. 1. Visible are drain D, source S, and gate G of MOSFETs M1, M2, each connected to n-regions 21, with parasitic lateral bipolar transistors situated underneath gates G of the MOSFETs M1, M2. The bipolar transistor is provided so that in the case of ESD the electrical current is essentially conducted horizontally underneath gate G in substrate 30, the electrical current being limited by a current limiting resistor R1 formed in n-region 21. The dimensioning of current limiting resistor R1 can take place for example via a suitable doping or controlling of the salicide process.

Figure 3:
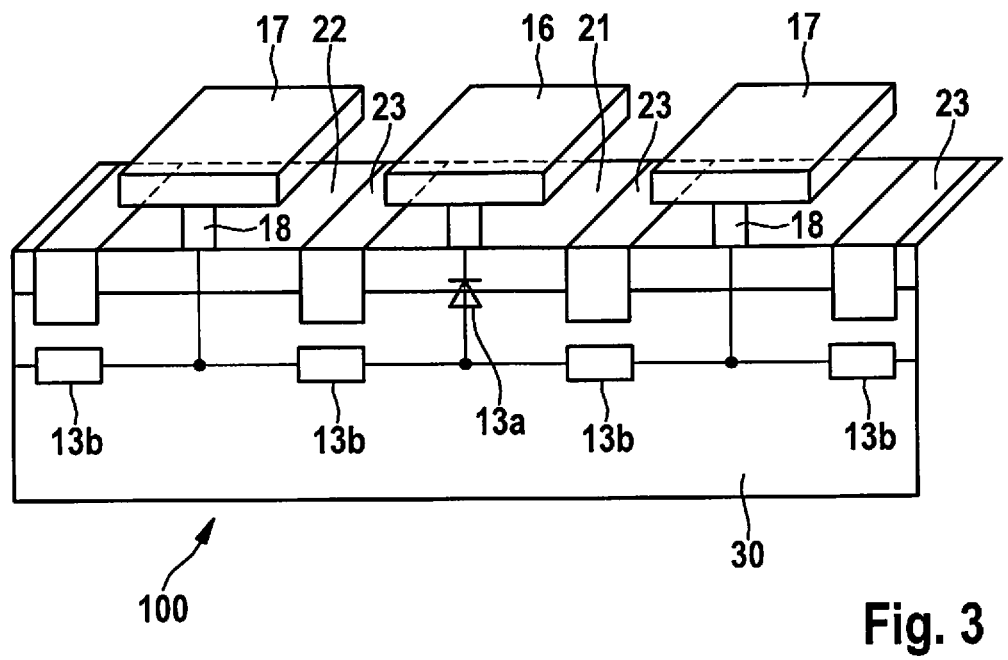
FIG. 3 shows a sectional view through a specific embodiment of a proposed ESD protective device for a MEMS element.

FIG. 3 shows a schematic view of a first specific embodiment of a proposed protective device 100 for a MEMS element. Visible is a p-region 22 (positively highly doped region) connected to an insulating region 23 (electrically insulating region). An n-region 21 (negatively highly doped region) is connected to insulating region 23. It will be seen that in this way, as a result a protective diode 13a is formed below n-region 21, which diode is connected in series with an electrical resistor 13b. P-region 22 is connected to a line 17 via an electrical contact 18. Line 17 is connected to a circuit 20 (not shown) that is to be protected and to a terminal 15 (not shown). Line 16 is connected to circuit 20 that is to be protected (active part of the MEMS element), and to terminal 16 (not shown).

FIG. 3 thus shows a use and a function of a possible ESD protective device 100 inside a MEMS element. Protective device 100 is connected between line 17 of terminal 15 and line 16 of terminal 14. In this way, a current of an ESD shock at terminal 14 can be conducted directly into substrate 30 via diode 13a.

As a result, in this way protective device 100 is formed having a suitably connected and poled protective diode 13a. Due to p-regions 22 and n-regions 21, configured in alternating fashion with insulating regions 23 situated between them, when there is ESD the entire electrical current is, as it were, forced "to flow into the deep." Due to highly doped regions 21, 22 situated next to one another, a low electrical breakdown voltage can advantageously be achieved for protective diode 13a.

An improved protective effect of protective device 100 for the MEMS element results due to a multiplicity of the elements named above. P-regions 22 are here connected to lines 17 by respective contact elements 18. In this way, protective diode 13a is connected in the blocking direction between terminal 16 and substrate 30, and as a result there is no flow of current through diode 13a, except for a small leakage current. The supply lines and discharge lines are made as low-ohmic as possible here. Preferably, the wiring of lines 16, 17 is realized in such a way that the effectively acting resistance 13b is the same for each part of the p-n junction between the n-regions and the p-regions.

If terminal 14 is now exposed to positive ESD stress, then the electrical voltage increases until diode 13a breaks down. The space filled by isolating region 13 between doped regions 21, 22, and the symmetrically or multiply realized wiring 16, 17, result in a distribution of the electrical breakdown current. In this way, it is advantageously achieved that the electrical power loss is distributed, hotspots are avoided, and in this way protective device 100 can withstand the ESD load without damage.

In the case of negative ESD stress, protective device 100 becomes directly conductive. In this case as well, the space filled by insulating region 23 between the doped regions 21, 22, and the symmetrical wiring 16, 17, distribute the power loss, which in this case is significantly lower and thus less critical due to the low electrical flux voltage of diode 13a.

The wiring and the electrical breakdown voltage of diode 13a are preferably dimensioned such that the electrical voltages that occur in the ESD case do not exceed the electrical strength of the connected components or circuits 20 that are to be protected. For this purpose, it can be necessary to increase the electrical strength of the components or circuits 20 that are to be protected.

This can be achieved for example by n-Nwell-Psub junctions (not shown), and/or series resistors (not shown), and/or by increased geometrical spacings. Via the n-Nwell-Psub junctions, "soft junctions" can advantageously be realized between the doping regions for the electronic circuit 20 to be protected, further increasing the electrical strength of the MEMS element.

As a result, with the proposed protective device the robustness of the overall MEMS element to ESD effects can be increased.

Figure 4:
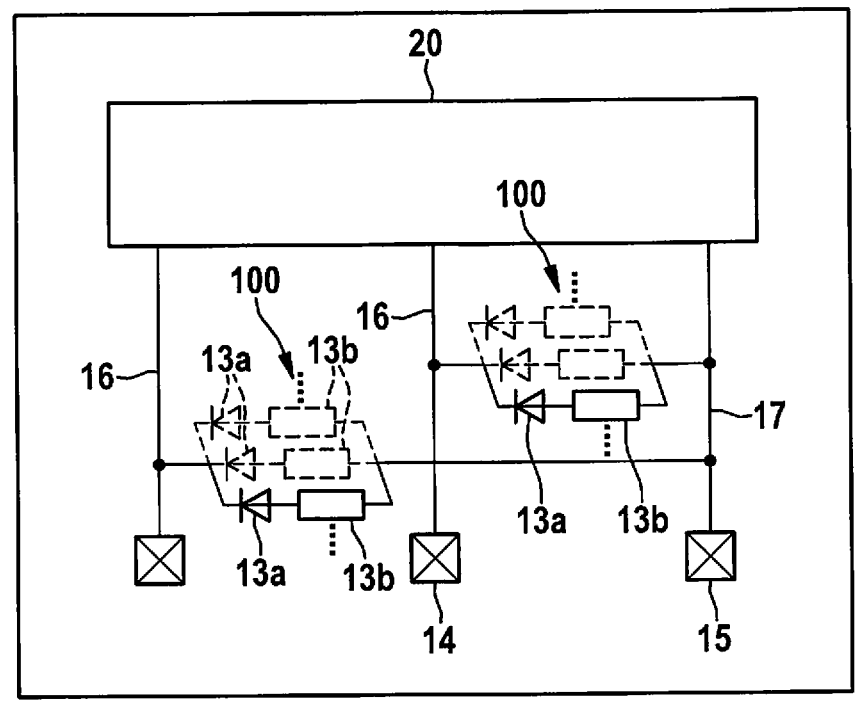
FIG. 4 shows a schematic diagram of a specific embodiment of the proposed ESD protective device for a MEMS element.

FIG. 4 shows a schematic diagram of a proposed protective device 100. It will be seen that diodes 13a and resistors 13b are multiply realized, lessening negative effects of ESD.

Figure 5:
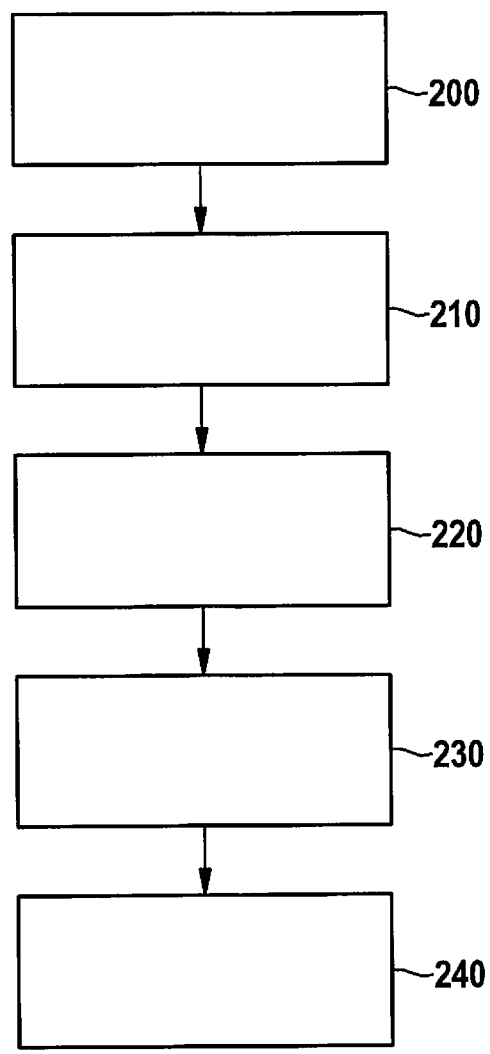
FIG. 5 shows a schematic sequence of a method for producing a proposed ESD protective device for a MEMS element.

FIG. 5 shows a schematic sequence of a method for producing an ESD protective device for a MEMS element.

In a step 200, a first line 16 is provided.

In a step 210, an n-region 21, connected to first line 16, is provided.

In a step 220, an insulating region 23, connected to n-region 21, is provided.

In a step 230, a p-region 22, connected to insulating region 23, is provided.

In a step 240, a second line 17, connected to p-region 22, is provided, n-region 21, insulating region 23, and p-region 22 being situated on a substrate 30.

Of course, the named steps 200 . . . 240 can be exchanged with one another in any suitable manner.

As a result, using the limited capabilities of a MEMS process, which in particular does not enable the formation of MOS transistors, an effective protective structure for MEMS elements is advantageously provided.

These elements can be protected so to speak in an intermediate stage before they are completely assembled in a sensor element, whereby other elements of the sensor element then take over the ESD protective functionality. As a result, a kind of intermediate protection for the MEMS element is provided during the production process.

This is achieved with a thermal volume, so that locally limited damage can be prevented. In this way, a multiplicity of diodes is provided between the terminals, which, together with the resistors, distribute the energy of the ESD shock. In this way, the protective diode does not represent a single concentrated element, but rather a multiplicity of elements, and is thus a kind of "distributed element."

Although the present invention has been described above on the basis of concrete exemplary embodiments, the person skilled in the art will also realize specific embodiments that are not disclosed, or are only partly disclosed, without departing from the present invention.

What is claimed is:

1. An ESD protective device for an MEMS element, comprising:
    at least one first line;
    at least one n-region connected to the first line;
    at least one insulating region connected to the n-region;
    at least one p-region connected to the insulating region;
    at least one second line connected to the p-region, wherein the n-region, the insulating region, and the p-region are on a substrate;
    wherein a line is connectable to a circuit that is to be protected, as a part of the MEMS element,
    wherein the p-region is connected to another line via an electrical contact, and wherein the another line is connectable to the circuit,
    wherein a protective diode is formed below the n-region, and wherein the protective diode is connected in series with an electrical resistor, and
    wherein the protective diode is connected in a blocking direction between a terminal and the substrate, so that there is essentially no flow of current through the protective diode except for a leakage current.

2. The ESD protective device as recited in claim 1, wherein a defined number of first lines, n-regions connected to the first lines, insulating regions connected to the n-regions, p-regions connected to the insulating regions, and second lines connected to the p-regions are situated on the substrate.

3. The ESD protective device as recited in claim 1, wherein the ESD protective device is produced using a MEMS process.

4. A method for producing an ESD protective device for a MEMS element, comprising:
    providing a first line;
    providing an n-region connected to the first line;
    providing an insulating region connected to the n-region;
    providing a p-region connected to the insulating region;
    providing a second line connected to the p-region, wherein the n-region, the insulating region, and the p-region are on a substrate;
    wherein a line is connectable to a circuit that is to be protected, as a part of the MEMS element,
    wherein the p-region is connected to another line via an electrical contact, and wherein the another line is connectable to the circuit,
    wherein a protective diode is formed below the n-region, and wherein the protective diode is connected in series with an electrical resistor, and
    wherein the protective diode is connected in a blocking direction between a terminal and the substrate, so that there is essentially no flow of current through the protective diode except for a leakage current.

* * * * *